(12) United States Patent
Katano et al.

(10) Patent No.: US 9,047,905 B2
(45) Date of Patent: Jun. 2, 2015

(54) RECORDING MEDIUM

(75) Inventors: Tomonori Katano, Matsumoto (JP);
Akiyasu Kumagai, Matsumoto (JP);
Katsumi Taniguchi, Matsumoto (JP);
Hiromi Ono, Matsumoto (JP); Narumi Sato, Matsumoto (JP)

(73) Assignee: FUJI ELECTRIC CO., LTD. (JP)

( * ) Notice: Subject to any disclaimer, the term of this patent is extended or adjusted under 35 U.S.C. 154(b) by 110 days.

(21) Appl. No.: 13/557,683

(22) Filed: Jul. 25, 2012

(65) Prior Publication Data
US 2013/0034746 A1 Feb. 7, 2013

(30) Foreign Application Priority Data

Aug. 4, 2011 (JP) ................. 2011-171013

(51) Int. Cl.
*G11B 5/66* (2006.01)
*G11B 5/72* (2006.01)
*G11B 5/84* (2006.01)
*C23C 16/26* (2006.01)
*C23C 16/511* (2006.01)

(52) U.S. Cl.
CPC ............. *G11B 5/72* (2013.01); *G11B 5/8408* (2013.01); *C23C 16/26* (2013.01); *C23C 16/511* (2013.01)

(58) Field of Classification Search
None
See application file for complete search history.

(56) References Cited

U.S. PATENT DOCUMENTS

| 5,607,783 | A | 3/1997 | Onodera | |
| 6,358,636 | B1 * | 3/2002 | Yang et al. | 428/833.2 |
| 6,572,958 | B1 * | 6/2003 | Chour et al. | 428/213 |
| 2001/0031382 | A1 * | 10/2001 | Kusakawa et al. | 428/694 TC |
| 2003/0224216 | A1 * | 12/2003 | Hiratsuka et al. | 428/694 ST |
| 2013/0337290 | A1 * | 12/2013 | Nakamata | 428/833.2 |

FOREIGN PATENT DOCUMENTS

| JP | 09-138943 A | 5/1997 |
| JP | 11-203625 A | 7/1999 |
| JP | 2004-152462 A | 5/2004 |
| JP | 2008-123671 A | 5/2008 |

OTHER PUBLICATIONS

John Robertson, "The deposition mechanisn of diamond-like a-C and a-C:H", Diamond Related MAterials, vol. 3, Jan. 1994, pp. 361-368.*
Nobuto Yasui et al.; "Influences of Substrates on Initial Growth of Diamond-Like Carbon Films"; Applied Physics Express 1 (2008) 035002; pp. 035002-1-035002-3.
Japanese Office Action cited in Japanese counterpart application No. JP2011-171013, dated Feb. 17, 2015. English translation provided.

* cited by examiner

*Primary Examiner* — Holly Rickman
(74) *Attorney, Agent, or Firm* — Rossi, Kimms & McDowell LLP

(57) ABSTRACT

A recording medium for recording and reproducing information by means of a head which performs information readout and writing based on magnetic principles is disclosed. The medium comprises a magnetic layer formed on a substrate and a protective layer formed on the magnetic layer. The protective layer comprises an underlayer formed on the magnetic layer and includes a material selected from the group consisting of silicon, silicon carbide and germanium. A carbon layer formed on the underlayer includes amorphous carbon containing hydrogen. The amount of hydrogen in the carbon layer is 24.7 at % or higher and 46.8 at % or lower, the thickness of the underlayer is 0.3 nm or greater and 1.8 nm or less, and the thickness of the carbon layer is 0.2 nm or greater and 1.7 nm or less. The medium exhibits corrosion resistance, sliding durability and head flying characteristics, and reduces magnetic spacing while securing reliability.

13 Claims, 1 Drawing Sheet

RECORDING MEDIUM

This application is based on and claims priority to Japanese Patent Application 2011-171013, filed on Aug. 4, 2011. The disclosure of the priority application in its entirety, including the drawings, claims, and the specification thereof, is incorporated herein by reference.

BACKGROUND OF THE INVENTION

A. Field of the Invention

This invention relates to a recording medium used in recording devices, particularly hard disk devices, mounted in consumer equipment or in information recording devices of computers or other information processing equipment.

B. Description of the Related Art

Increases in the quantity of information handled by computers and other information processing equipment in recent years, and miniaturization of information recording equipment, have been accompanied by expansion of the recording capacities of information recording devices, and recording capacities sought from magnetic recording media used in information recording devices continue to trend upward. In order to increase the recording capacities and improve the recording performance of magnetic recording media, the distance between the read/write elements of the magnetic head and the magnetic layer of the magnetic recording medium, that is, the magnetic spacing, must be decreased to the maximum extent possible. The magnetic spacing is determined by the thickness of the magnetic head protective layer, the flying height of the magnetic head, and the thicknesses of the protective layer and lubrication layer of the recording medium. One development goal for recording media is reduction of the thickness of the protective layer. As the protective layer for recording media, an amorphous carbon material called DLC (Diamond-Like Carbon) is generally employed.

FIG. 2 is a schematic cross-sectional view of a recording medium of the prior art. In FIG. 2, recording medium 1 comprises substrate 2, magnetic layer (magnetic metal layer) 3 in which information is recorded by a magnetic head, protective layer 4 which protects magnetic layer 3 from corrosion, wear, shocks, and other damage, and lubrication layer 5 covering the surface of protective layer 4. Substrate 2 is formed from glass, an aluminum material with a plated surface, or similar, and serves as a base. Magnetic layer 3 is a granular layer comprising, for example, Co, Cr, Pt, or another metal, and $SiO_2$ or similar, and is deposited by sputtering. It is preferable that DLC be employed as protective layer 4. The protective layer is deposited by sputtering or by plasma CVD (Chemical Vapor Deposition). PFPE (perfluoropolyether) is preferably used in lubrication layer 5, which is formed to a thickness of approximately 1 nm by a dipping method or similar. The recording density of a recording medium of the prior art is approximately 500 Gbits/in$^2$, and the thickness of protective layer 4 is approximately 3 nm. Hereafter, in order to raise the recording density to 750 Gbits/in$^2$ or higher, the thickness of protective layer 4 must be reduced to 2 nm or less. To further raise the recording density to 2000 Gbits/in$^2$ in the future, the thickness of protective layer 4 must be made approximately 1 nm.

On the other hand, protective layer 4 of a recording medium is also required to have sufficient reliability, that is, corrosion resistance, sliding durability, and head flying characteristics, and similar reliability is required even when the film thickness is reduced. However, adequate reliability, and in particular corrosion resistance and sliding durability, has not been obtained from DLC formed by methods of the prior art in the thickness range of 2 nm or less. It is thought that by forming protective layer 4 with a finer texture, that is, by increasing the sp$^3$ ratio of the carbon layer, adequate reliability may be obtained.

In order to raise the sp$^3$ ratio of protective layer 4, sufficient energy may be imparted to particles obtained by dissociation and ionization of carbon raw material in a process of subplantation, that is, causing the particles to penetrate below the surface layer. The penetrating ionized particles enter a state of high compressive stress in the carbon layer (protective layer 4), and as a result carbon sp$^3$ bonds are induced, and the sp$^3$ ratio is raised. Specifically, a method called the FCA (Filtered Cathodic Arc) or FCVA (Filtered Cathodic Vacuum Arc) method is known. In this method, arc discharge is used to generate plasma from a graphite or other carbon target, and film is deposited by means of the C$^+$ and other ionized particles contained therein, raising the sp$^3$ ratio, and at the same time enabling formation of a hard carbon layer not containing hydrogen. FCA has been used to fabricate protective layers 4 of magnetic heads in hard disk devices, and its application to recording media has been studied.

However, at the beginning of film deposition, that is, in the stage of this method in which film deposition on the magnetic layer 3 is begun, ionized particles directly penetrate magnetic layer 3, and metal atoms with which the ionized particles collide recoil in the carbon layer direction, so that mixing with carbon atoms occurs. A carbon layer in such a mixed state cannot have the characteristics inherent to carbon; that is, it can be said that the initial growth layer has a low sp$^3$ ratio. Further, a metal element which is a cause of corrosion is included, and this also leads to degradation of corrosion resistance. If protective layer 4 is sufficiently thick no problems arise, but if protective layer 4 is thin, the thickness of the initial growth layer cannot be ignored, and consequently adequate corrosion resistance cannot be obtained.

One report of measures to address, mixing is given in Nobuto Yasui, Hiroshi Inaba and Naoto Ohtake: *Applied Physics Express* 1 (2008), 035002, in which an underlayer comprising a silicon material is interposed between a carbon layer formed by FCA and a metal layer, preventing penetration of ionized particles into the metal layer and preventing recoil of the metal element, to improve corrosion resistance.

As other proposals to apply an underlayer to a carbon layer similarly to that described above, there exist Japanese Patent Application Laid-open No. H9-138943 and Japanese Patent Application Laid-open No. H11-203625. In Japanese Patent Application Laid-open No. H9-138943, in addition to a silicon material, underlayers of germanium, tin, and other materials are interposed, and these are used as buffer layers to reduce the residual strain in the carbon layer. By this technique sliding durability is improved, and the protective layer can be made thinner, but the protective layer thickness is still 2.5 nm, and there is further room for improvement. Japanese Patent Application Laid-open No. H11-203625 is an example of application to a magnetic head. A material having silicon as its main component is interposed as an underlayer, with the underlayer thickness at 0.5 nm or greater and the carbon layer thickness at 2 nm or greater. The underlayer functions as an adhesive layer, and it is claimed that by this means adhesion of the carbon layer is enhanced, sliding durability is improved, and the protective layer thickness can be reduced. However, in this method the surface on which the protective film is formed is polished to reduce the roughness and obtain a protective film with uniform coverage, and application to a recording medium is difficult. Further, it is stated that at protective layer thicknesses, that is, total thicknesses for the carbon layer and underlayer of less than 2 nm, the film is not continuous but has an island-like morphology, and reliability is insufficient. Further, in Japanese Patent Application Laid-open No. H11-203625, CCP (Capacitively Coupled Plasma)-CVD and ECR (Electron Cyclotron Resonance)-CVD methods are used as the method of formation of the protective layer, and a protective film into which $sp^3$ bonds are appropriately introduced cannot be formed.

It has also been proposed that reliability be improved by regulating the hydrogen content of the carbon layer, to accommodate reduced thickness of the protective layer. In Japanese Patent Application Laid-open No. 2008-123671, the hydrogen content of the carbon layer is limited to from 8 to 18 at %, to raise the $sp^3$ ratio and improve the medium reliability. In Japanese Patent Application Laid-open No. 2004-152462, the hydrogen content of the carbon layer surface is made 30% or lower, to secure head flying characteristics and improve reliability. The hydrogen contents in both references are low values for DLC, and lowering the amount of hydrogen leads to improvement. The previously described reference of Nobuto Yasui, Hiroshi Inaba and Naoto Ohtake: *Applied Physics Express* 1 (2008), 035002 uses the FCA method of film deposition, in which hydrogen is essentially not included in the film, and thus can be said to use the same approach.

While the above-described proposals have effects in improving reliability for protective layer thicknesses in a certain range, at protective layer thicknesses which are further reduced, reliability has been inadequate.

The present invention was devised in light of the above-described problems, and provides a recording medium for which corrosion resistance, sliding durability and head flying characteristics can be secured, and which enables reduced magnetic spacing while securing reliability, so that recording densities of for example from 750 to 2000 Gbit/in$^2$ can be accommodated.

In order to resolve the above problems, a recording medium of this invention is used to record and reproduce information by means of a head which performs information readout and writing based on magnetic principles. The medium comprises a magnetic layer formed on a substrate and a protective layer formed on the magnetic layer. The protective layer comprises an underlayer formed on the magnetic layer and including a material selected from the group consisting of silicon, silicon carbide and germanium, and a carbon layer formed on the underlayer and including amorphous carbon containing hydrogen; an amount of hydrogen included in the carbon layer is 24.7 at % or higher and 46.8 at % or lower, a thickness of the underlayer is 0.3 nm or greater and 1.8 nm or less, and a thickness of the carbon layer is 0.2 nm or greater and 1.7 nm or less.

It is preferable that the hydrogen amount included in the carbon layer exceed 30.3 at % and be 46.8 at % or lower, and that a total thickness of the underlayer and the carbon layer be 1 nm or greater and 2 nm or less.

SUMMARY OF THE INVENTION

By means of a recording medium of this invention, corrosion resistance, sliding durability and head flying characteristics can be secured, so that the magnetic spacing can be reduced while securing reliability, and a magnetic recording medium accommodating recording densities of, for example, 750 to 2000 Gbit/in$^2$ can be provided.

In particular, if an underlayer including silicon is used, recoil of a metal element of the magnetic layer is prevented, and in addition carbon can grow conforming to silicon material, which structurally forms $sp^3$ bonds, so that the carbon $sp^3$ ratio, that represents structural fineness, is improved from the initial growth phase. In addition, considering specified thicknesses range of carbon layers to which this invention is applied, that is, thin films in the range 1.7 nm or less, rather than excluding hydrogen for hardening the film, if a film containing hydrogen in the amounts of this invention (24.7 at % or higher and 46.8 at % or lower) is deposited under comparatively low-energy conditions, then particles migrate over the silicon and the carbon layer coverage is improved without the formation of pinholes and the like, and corrosion resistance is improved.

According to the invention, a recording medium for recording and reproducing information by means of a head which performs information readout and writing based on magnetic principles comprises:
  a substrate;
  a magnetic layer formed on a substrate; and
  a protective layer formed on the magnetic layer, the protective layer comprising:
    an underlayer formed on the magnetic layer comprising a material selected from the group consisting of silicon, silicon carbide and germanium, a thickness of the underlayer being 0.3 nm or greater and 1.8 nm or less, and
    a carbon layer comprising amorphous carbon containing hydrogen formed on the underlayer, an amount of hydrogen included in the carbon layer being 24.7 at % or higher and 46.8 at % or lower, and a thickness of the carbon layer being 0.2 nm or greater and 1.7 nm or less.

Preferably, the amount of hydrogen included in the carbon layer exceeds 30.3 at % and is 46.8 at % or lower. Preferably the total thickness of the underlayer and the carbon layer is 1 nm or greater and 2 nm or less.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1:
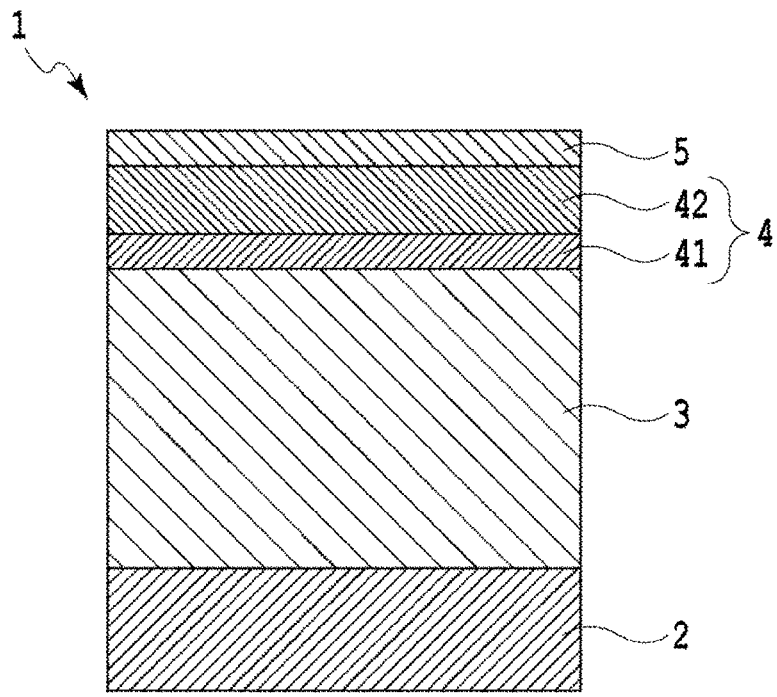
FIG. 1 is a schematic cross-sectional view explaining one example of the layer configuration of a recording medium of this invention.

Below, embodiments of the invention are explained referring to the drawings. FIG. 1 is a schematic cross-sectional view explaining one example of the layer configuration of a recording medium of this invention. Recording medium 1 typically comprises substrate 2; magnetic layer 3 comprising a magnetic material formed on substrate 2; underlayer 41 formed on magnetic layer 3; protective layer 42 formed on underlayer 41; and lubrication layer 5 formed on protective layer 42.

Figure 2:
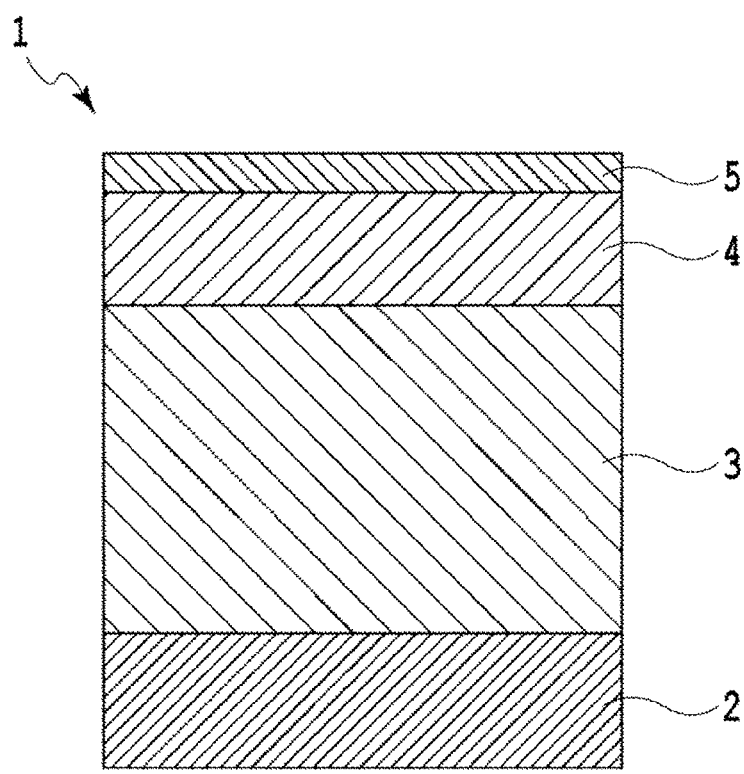
FIG. 2 is a schematic cross-sectional view explaining one example of the layer configuration of a recording medium of the prior art.

Substrate 2, magnetic layer 3 and lubrication layer 5 can be formed using materials and manufacturing methods similar to those of a recording medium of the prior art, shown in FIG. 2, and explanations thereof are omitted.

Underlayer 41 is formed on magnetic layer 3, and includes a material selected from the group consisting of silicon, silicon carbide and germanium. The process of forming underlayer 41 is performed using a sputtering target comprising a material selected from the group consisting of silicon, silicon carbide and germanium.

Carbon layer 42 is formed on the underlayer, and includes amorphous carbon containing hydrogen. Carbon layer 42 is formed using ethylene, acetylene or another hydrocarbon gas raw material, or xylene, toluene, benzene or another hydrocarbon liquid raw material, by a plasma CVD method enabling introduction of hydrogen into the carbon layer. The ECWR method is preferable as the plasma source used, but a parallel plate method, ICP (Inductively Coupled Plasma) method, ECR method, or similar can be chosen according to the application.

Examples

Below, examples and comparative examples of the invention of this application are explained. The examples are merely representative examples of the invention, and the invention of this application is in no way limited to the descriptions of the examples.

First the method of evaluation is explained, and then specific examples and the results thereof are explained.

In evaluating film thickness, after performing calibration with film thicknesses measured in advance by the cross-sectional TEM (Transmission Electron Microscopy) method, film thicknesses were determined from the number of photoelectrons generated in XPS (X-ray Photoelectron Spectroscopy). Hydrogen content was determined by the ERDA (Elastic Recoil Detection Analysis) method, in which recoil hydrogen ions due to $N_2^+$ ion irradiation were detected and calculations performed based on simulation fitting.

Corrosion resistance, sliding durability, and head flying characteristics were selected as characteristic quantities of magnetic recording media for evaluation. Corrosion resistance was evaluated by dripping a 3% nitric acid solution onto the protective layer surface, and after leaving for one hour, recovering the solution, and measuring the amount of Co eluted by ICP-MS (Inductively Coupled Plasma Mass Spectrometer), and dividing by the area of the drops of nitric acid solution. In judging corrosion resistance, when the elution amount was 0.1 ng/cm$^2$ or lower, which is necessary so as not to cause problems in reliability tests when applied in hard disk devices, a result of "◯" (pass) was assigned, and when this value was exceeded a result of "x" (fail) was assigned. For sliding durability, an alumina-titanium carbide ball of diameter 2 mm was pressed with a load of 30 gf against the surface of a medium and caused to rotate, and changes in the lubrication between the ball and the medium surface were measured as changes in the friction force. Cases in which there was no loss of lubrication over 300 sliding durability trials, necessary to secure reliability, were assigned "◯" (pass), and cases in which the friction force increased suddenly and lubrication was lost were assigned "x" (fail). To evaluate head flying characteristics, a head which uses a piezoelectric element to measure contact between the medium and head was flown over the medium surface, and the maximum output voltage of the piezoelectric element was used for evaluation. Cases in which the voltage was 150 mV or lower, necessary to secure reliability, were assigned "◯" (pass), and cases in which this was exceeded were assigned "x" (fail). Samples were fabricated with the thicknesses of the underlayer and carbon layer and the hydrogen content of the carbon layer as parameters, and evaluation results appear in Table 1. When fabricating samples, the thicknesses of the underlayer and carbon layer were adjusted through the film deposition times, and the hydrogen content of the carbon layer was adjusted through the RF output.

Examples

A granular magnetic layer comprising Co, Cr, Pt, or another metal and $SiO_2$ or similar was formed by sputtering on a 2.5-inch glass substrate. The granular magnetic layer was not polished. On this layer, an underlayer of a silicon material was deposited by sputtering using argon gas under conditions of a pressure of 0.5 Pa and output power of 100 W.

Following this, an ECWR plasma source was used with ethylene as the raw material to deposit a carbon layer such that the hydrogen content was 30 or 45 at %. For samples fabricated with a targeted hydrogen content of 30 at %, an ECWR plasma source was used with ethylene as the raw material with deposition conditions of an output power of 1050 W and a pressure of 0.09 Pa applied. For samples fabricated with a targeted hydrogen content of 45 at %, film deposition conditions of an output power of 190 W and a pressure of 0.35 Pa were applied. The thicknesses of the underlayer and carbon layer were set by using samples with various film thicknesses and hydrogen amounts within the ranges of this invention, centered on conditions for which the protective layer thickness (total film thickness of the underlayer and carbon layer) was 1 nm. Then, a dipping method was used to form a 1 nm PFPE lubrication layer on the carbon layer, to obtain the samples 1-C-2 to 1-C-3, 1-D-2 to 1-D-6, and 1-E-2 to 1-E-7 in Table 1. Evaluation results indicated that, as indicated in Table 1, all the samples passed the criteria set with respect to corrosion resistance, sliding durability and head flying characteristics.

Among these samples, the samples 1-D-2 to 1-D-6 and 1-E-2 to 1-E-7 had Co elution amounts of 0.05 ng/cm$^2$ or lower, which are ½ the elution amount of 0.1 ng/cm$^2$ or less necessary to avoid problems in reliability tests, and consequently it was found that if the hydrogen content exceeds 30 at % and is 48 at % or lower, even higher corrosion resistance than normal can be secured.

Comparative Example 1

After depositing up to the underlayer of silicon material similarly to the Example of this invention, a carbon layer was deposited such that the hydrogen content of the carbon layer was either 3 at % or lower, or 20 at %. Samples for which the targeted hydrogen content was 3 at % or lower were formed by depositing the carbon layer by FCA under conditions of an arc current of 120 A and voltage of 30 V. Samples with a targeted hydrogen content of 20 at % were deposited using an ECWR plasma source with ethylene as the raw material, to deposit the carbon layer under conditions of an output power of 3000 W and a pressure of 0.02 Pa. The thicknesses of the underlayer and the carbon layer were set centered on conditions such that the protective layer thickness was 1 nm by using samples with various film thicknesses and hydrogen amounts. Then, a dipping method was used to form a 1 nm PFPE lubrication layer on the carbon layer, to obtain the samples 1-A-1 to 1-A-4 and 1-B-1 to 1-B-3 in Table 1. As the result of evaluations, except for a portion of the samples, the criteria for sliding durability and head flying characteristics were passed, the Co elusion amount exceeded the criterion, and corrosion resistance was inadequate. Thus, as the carbon film thickness is reduced, with respect to the domain in which the influence of the initial growth layer is large, corrosion resistance is not high under conditions for which the hydrogen content is low (less than 24.7 at %) and the film is hardened. Rather, conditions described in the Example of this invention, in which hydrogen is included in an appropriate amount (24.7 at % or higher and 46.8 at % or lower) at comparatively low energy results in improved corrosion resistance. This is thought to be because particles deposited on the silicon migrated, so that pinholes were not formed and the carbon layer coverage was improved, with advantageous consequences for corrosion resistance.

Comparative Example 2

After depositing up to the underlayer of silicon material similarly to the case of the Example of this invention, a carbon layer was deposited such that the hydrogen content of the carbon layer was 25, 30, or 45 at %. Film deposition conditions were similar to those for the case of the Example of this invention. The thicknesses of the underlayer and carbon layer were made 0.1 nm and 0.9 nm respectively. Then, a dipping method was used to form a 1 nm PFPE lubrication layer on the carbon layer, to obtain the samples 1-C-1, 1-D-1 and 1-E-1 in Table 1. Evaluation results indicated that none of the samples had adequate corrosion resistance, and even when the hydrogen content of the carbon layer was appropriate, if the underlayer thickness is less than 0.3 nm, corrosion resistance is inadequate. This is thought to be because when the underlayer thickness is less than 0.3 nm, the silicon material cannot take on a stable $sp^3$ structure, and there is no improvement of the $sp^3$ ratio, that represents the structural fineness, of the carbon layer formed as a result.

Comparative Example 3

After depositing up to the underlayer of silicon material similarly to the case of the Example of this invention, a carbon layer was deposited such that the hydrogen content of the carbon layer was 25, 30, or 45 at %. Film deposition conditions were similar to those for the case of the Example of this invention. The thicknesses of the underlayer and carbon layer were made 0.9 nm and 0.1 nm respectively. Then, a dipping method was used to form a 1 nm PFPE lubrication layer on the carbon layer, to obtain the samples 1-C-4, 1-D-7 and 1-E-8 in Table 1. Evaluation results indicated that although corrosion resistance was adequate, sliding durability was not adequate. Even when the hydrogen content was appropriate, if the thickness of the carbon layer was less than 0.2 nm the sliding durability was inadequate. This is thought to be because when the carbon layer is less than 0.2 nm thick the carbon structure is lost, and the sliding durability which is inherent in carbon does not function.

Comparative Example 4

After depositing up to the underlayer of silicon material similarly to the case of the Example of this invention, a carbon layer was deposited such that the hydrogen content of the carbon layer was 55 at %. Film deposition conditions were similar to those for the case of the Example of this invention. The thicknesses of the underlayer and carbon layer were set such that the protective layer thickness was 1 nm. Then, a dipping method was used to form a 1 nm PFPE lubrication layer on the carbon layer, to obtain the samples 1-F-1 to 1-F-4 in Table 1. Evaluation results indicated that there were substantially no adequate results for corrosion resistance, sliding durability or head flying characteristics, and no samples for which all three parameters were adequate were obtained. This is thought to be because when the hydrogen content exceeds 46.8 at %, the carbon layer approaches a polymer structure, and characteristics inherent to carbon are lost.

The above are cases in which silicon was used in the underlayer, but similar results were obtained upon using silicon carbide. Table 2 shows evaluation results when silicon carbide was used, with film deposited by sputtering under the conditions of an argon gas pressure of 1 Pa and output power of 200 W. Other sample fabrication conditions were similar to those for the case of silicon. In Table 1, in which silicon was used in the underlayer, the beginning digit of sample numbers was "1", whereas in Table 2, in which silicon carbide was used, the beginning digit was "2"; samples in Tables 1 and 2 for which the subsequent notation was the same were fabricated using the same conditions.

From Table 2, similarly to the case of silicon, if the hydrogen content of the carbon layer was 24.7 at % or higher and 46.8 at % or lower, the thickness of the underlayer was 0.3 nm or greater and 1.8 nm or less, and the thickness of the carbon layer was 0.2 nm or greater and 1.7 nm or less, then the corrosion resistance, sliding durability and head flying characteristics required of media could be satisfied for protective layer thicknesses of 1 nm or greater and 2 nm or less. Further, similar results were obtained using germanium.

Table 3 indicates evaluation results when germanium film was deposited by sputtering under conditions of an argon gas pressure of 0.5 Pa and output power of 300 W; results similar to those for silicon were obtained. In this application, the target for the total thickness of the carbon layer and underlayer was set in the range 2 nm or less, but because satisfactory results were obtained in cases in which the underlayer thickness was 0.3 nm or greater, it is thought that if the upper limit for the carbon layer thickness is 1.7 nm or less, satisfactory results can be obtained within the range of the target for total thickness (2 nm) of this application.

TABLE 1

Evaluation results for the Example and Comparative Examples for the case of a silicon underlayer

| Sample number | Underlayer thickness, nm | Carbon layer thickness, nm | Protective layer thickness, nm | Hydrogen content, at % | Co elution amount, ng/cm$^2$ | Corrosion resistance | Sliding durability | Head flying characteristics |
|---|---|---|---|---|---|---|---|---|
| 1-A-1 | 0.1 | 0.9 | 1 | 1.3 | 0.92 | x | | |
| 1-A-2 | 0.4 | 0.7 | 1.1 | 1.4 | 0.30 | x | ⊗ | ⊗ |
| 1-A-3 | 0.8 | 0.2 | 1 | 1.0 | 0.16 | x | ⊗ | ⊗ |
| 1-A-4 | 1.2 | 0.1 | 1.3 | 1.2 | 0.13 | x | x | ⊗ |
| 1-B-1 | 0.3 | 0.8 | 1.1 | 21.9 | 0.14 | x | ⊗ | ⊗ |
| 1-B-2 | 0.5 | 0.5 | 1 | 22.7 | 0.12 | x | ⊗ | ⊗ |
| 1-B-3 | 0.9 | 0.1 | 1 | 19.2 | 0.14 | x | x | ⊗ |
| 1-C-1 | 0.1 | 1.1 | 1.2 | 25.9 | 0.15 | x | | |
| 1-C-2 | 0.3 | 0.7 | 1 | 24.7 | 0.09 | ⊗ | ⊗ | ⊗ |
| 1-C-3 | 1.1 | 0.2 | 1.3 | 25.6 | 0.07 | ⊗ | ⊗ | ⊗ |

TABLE 1-continued

Evaluation results for the Example and Comparative Examples for the case of a silicon underlayer

| Sample number | Underlayer thickness, nm | Carbon layer thickness, nm | Protective layer thickness, nm | Hydrogen content, at % | Co elution amount, ng/cm² | Corrosion resistance | Sliding durability | Head flying characteristics |
|---|---|---|---|---|---|---|---|---|
| 1-C-4 | 0.9 | 0.1 | 1 | 26.6 | 0.08 | ⊗ | x | x |
| 1-D-1 | 0.1 | 1.1 | 1.2 | 30.7 | 0.26 | x | | |
| 1-D-2 | 0.3 | 0.7 | 1 | 30.3 | 0.04 | ⊗ | ⊗ | ⊗ |
| 1-D-3 | 0.5 | 0.8 | 1.3 | 30.1 | 0.02 | ⊗ | ⊗ | ⊗ |
| 1-D-4 | 0.8 | 0.2 | 1 | 28.2 | 0.03 | ⊗ | ⊗ | ⊗ |
| 1-D-5 | 0.9 | 1 | 1.9 | 34.6 | 0.009 | ⊗ | ⊗ | ⊗ |
| 1-D-6 | 1.8 | 0.2 | 2 | 30.1 | 0.01 | ⊗ | ⊗ | ⊗ |
| 1-D-7 | 0.9 | 0.1 | 1 | 28.5 | 0.04 | ⊗ | x | x |
| 1-E-1 | 0.1 | 0.9 | 1 | 47.7 | 0.31 | x | | |
| 1-E-2 | 0.3 | 0.7 | 1 | 46.8 | 0.05 | ⊗ | ⊗ | ⊗ |
| 1-E-3 | 0.3 | 1.5 | 1.8 | 45.1 | 0.03 | ⊗ | ⊗ | ⊗ |
| 1-E-4 | 0.5 | 0.6 | 1.1 | 45.7 | 0.03 | ⊗ | ⊗ | ⊗ |
| 1-E-5 | 0.5 | 1 | 1.5 | 41.8 | 0.02 | ⊗ | ⊗ | ⊗ |
| 1-E-6 | 0.8 | 0.2 | 1 | 45.4 | 0.03 | ⊗ | ⊗ | ⊗ |
| 1-E-7 | 1.8 | 0.2 | 2 | 45.5 | 0.008 | ⊗ | ⊗ | ⊗ |
| 1-E-8 | 0.9 | 0.1 | 1 | 44.4 | 0.05 | ⊗ | x | x |
| 1-F-1 | 0.1 | 1 | 1.1 | 55.1 | 0.61 | x | | |
| 1-F-2 | 0.3 | 0.7 | 1 | 53.8 | 0.14 | x | ⊗ | x |
| 1-F-3 | 0.6 | 0.6 | 1.2 | 52.8 | 0.08 | ⊗ | x | x |
| 1-F-4 | 0.8 | 0.2 | 1 | 52.4 | 0.12 | x | x | x |

TABLE 2

Evaluation results for the Example and Comparative Examples for the case of a silicon carbide underlayer

| Sample number | Underlayer thickness, nm | Carbon layer thickness, nm | Protective layer thickness, nm | Hydrogen content, at % | Co elution amount, ng/cm² | Corrosion resistance | Sliding durability | Head flying characteristics |
|---|---|---|---|---|---|---|---|---|
| 2-A-1 | 0.1 | 0.9 | 1 | 1.1 | 1.08 | x | | |
| 2-A-2 | 0.3 | 0.9 | 1.2 | 0.7 | 0.24 | x | ⊗ | ⊗ |
| 2-A-3 | 0.8 | 0.3 | 1.1 | 0.7 | 0.17 | x | ⊗ | ⊗ |
| 2-A-4 | 0.9 | 0.1 | 1 | 1.1 | 0.19 | x | x | ⊗ |
| 2-B-1 | 0.4 | 0.7 | 1.1 | 20.4 | 0.14 | x | ⊗ | ⊗ |
| 2-B-2 | 0.5 | 0.5 | 1 | 19.4 | 0.06 | x | ⊗ | ⊗ |
| 2-B-3 | 1 | 0.1 | 1.1 | 18.9 | 0.14 | x | x | ⊗ |
| 2-C-1 | 0.1 | 1.2 | 1.3 | 26.3 | 0.18 | x | | |
| 2-C-2 | 0.3 | 0.7 | 1 | 25.1 | 0.09 | ⊗ | ⊗ | ⊗ |
| 2-C-3 | 1.1 | 0.3 | 1.4 | 25.9 | 0.05 | ⊗ | ⊗ | ⊗ |
| 2-C-4 | 0.9 | 0.1 | 1 | 26.9 | 0.09 | ⊗ | x | x |
| 2-D-1 | 0.1 | 1 | 1.1 | 30.2 | 0.25 | x | | |
| 2-D-2 | 0.3 | 0.7 | 1 | 31.0 | 0.03 | ⊗ | ⊗ | ⊗ |
| 2-D-3 | 0.5 | 0.7 | 1.2 | 30.6 | 0.02 | ⊗ | ⊗ | ⊗ |
| 2-D-4 | 0.8 | 0.2 | 1 | 30.3 | 0.03 | ⊗ | ⊗ | ⊗ |
| 2-D-5 | 1 | 0.9 | 1.9 | 32.8 | 0.009 | ⊗ | ⊗ | ⊗ |
| 2-D-6 | 1.7 | 0.2 | 1.9 | 33.9 | 0.007 | ⊗ | ⊗ | ⊗ |
| 2-D-7 | 0.9 | 0.1 | 1 | 29.4 | 0.03 | ⊗ | x | ⊗ |
| 2-E-1 | 0.1 | 0.9 | 1 | 46.8 | 0.31 | x | | |
| 2-E-2 | 0.3 | 0.7 | 1 | 46.2 | 0.05 | ⊗ | ⊗ | ⊗ |
| 2-E-3 | 0.3 | 1.6 | 1.9 | 47.3 | 0.01 | ⊗ | ⊗ | ⊗ |
| 2-E-4 | 0.5 | 0.5 | 1 | 46.0 | 0.04 | ⊗ | ⊗ | ⊗ |
| 2-E-5 | 0.5 | 1 | 1.5 | 42.5 | 0.03 | ⊗ | ⊗ | ⊗ |
| 2-E-6 | 0.8 | 0.2 | 1 | 45.7 | 0.04 | ⊗ | ⊗ | ⊗ |
| 2-E-7 | 1.8 | 0.2 | 2 | 45.1 | 0.006 | ⊗ | ⊗ | ⊗ |
| 2-E-8 | 0.9 | 0.1 | 1 | 45.9 | 0.04 | ⊗ | x | x |
| 2-F-1 | 0.1 | 1 | 1.1 | 56.0 | 0.47 | x | | |
| 2-F-2 | 0.3 | 0.8 | 1.1 | 56.7 | 0.10 | x | ⊗ | ⊗ |
| 2-F-3 | 0.5 | 0.5 | 1 | 55.9 | 0.11 | ⊗ | x | x |
| 2-F-4 | 0.8 | 0.3 | 1.1 | 55.2 | 0.14 | x | x | x |

TABLE 3

Evaluation results for the Example and Comparative Examples for the case of a germanium underlayer

| Sample number | Underlayer thickness, nm | Carbon layer thickness, nm | Protective layer thickness, nm | Hydrogen content, at % | Co elution amount, ng/cm$^2$ | Corrosion resistance | Sliding durability | Head flying characteristics |
|---|---|---|---|---|---|---|---|---|
| 3-A-1 | 0.1 | 1.1 | 1.2 | 0.6 | 1.32 | x | | |
| 3-A-2 | 0.3 | 0.8 | 1.1 | 1.3 | 0.40 | x | ⊗ | ⊗ |
| 3-A-3 | 0.8 | 0.2 | 1 | 0.7 | 0.23 | x | ⊗ | ⊗ |
| 3-A-4 | 0.9 | 0.1 | 1 | 1.0 | 0.29 | x | x | ⊗ |
| 3-B-1 | 0.4 | 0.7 | 1.1 | 19.4 | 0.14 | x | ⊗ | ⊗ |
| 3-B-2 | 0.5 | 0.5 | 1 | 19.0 | 0.13 | x | ⊗ | ⊗ |
| 3-B-3 | 0.9 | 0.1 | 1 | 18.7 | 0.13 | x | x | ⊗ |
| 3-C-1 | 0.1 | 1.1 | 1.2 | 26.9 | 0.15 | x | | |
| 3-C-2 | 0.3 | 0.7 | 1 | 25.3 | 0.08 | ⊗ | ⊗ | ⊗ |
| 3-C-3 | 1.1 | 0.2 | 1.5 | 25.9 | 0.04 | ⊗ | ⊗ | ⊗ |
| 3-C-4 | 1.1 | 0.1 | 1.2 | 26.8 | 0.07 | ⊗ | x | x |
| 3-D-1 | 0.1 | 0.9 | 1 | 30.9 | 0.30 | x | | |
| 3-D-2 | 0.3 | 0.7 | 1 | 30.3 | 0.05 | ⊗ | ⊗ | ⊗ |
| 3-D-3 | 0.5 | 0.7 | 1.2 | 30.9 | 0.03 | ⊗ | ⊗ | ⊗ |
| 3-D-4 | 0.8 | 0.2 | 1 | 29.9 | 0.03 | ⊗ | ⊗ | ⊗ |
| 3-D-5 | 1 | 0.9 | 1.9 | 31.9 | 0.006 | ⊗ | ⊗ | ⊗ |
| 3-D-6 | 1.8 | 0.2 | 2 | 34.5 | 0.004 | ⊗ | ⊗ | ⊗ |
| 3-D-7 | 0.9 | 0.1 | 1 | 29.1 | 0.04 | ⊗ | x | x |
| 3-E-1 | 0.1 | 0.9 | 1 | 46.6 | 0.45 | x | | |
| 3-E-2 | 0.3 | 0.7 | 1 | 46.1 | 0.05 | ⊗ | ⊗ | ⊗ |
| 3-E-3 | 0.3 | 1.5 | 1.8 | 46.9 | 0.006 | ⊗ | ⊗ | ⊗ |
| 3-E-4 | 0.5 | 0.5 | 1 | 45.0 | 0.03 | ⊗ | ⊗ | ⊗ |
| 3-E-5 | 0.6 | 1 | 1.6 | 42.1 | 0.004 | ⊗ | ⊗ | ⊗ |
| 3-E-6 | 0.8 | 0.2 | 1 | 45.6 | 0.04 | ⊗ | ⊗ | x |
| 3-E-7 | 1.8 | 0.2 | 2 | 44.2 | 0.007 | ⊗ | ⊗ | x |
| 3-E-8 | 0.9 | 0.1 | 1 | 45.2 | 0.09 | ⊗ | x | x |
| 3-F-1 | 0.1 | 1 | 1.1 | 57.8 | 0.66 | x | | |
| 3-F-2 | 0.4 | 0.7 | 1.1 | 58.0 | 0.18 | x | x | x |
| 3-F-3 | 0.5 | 0.6 | 1.1 | 57.5 | 0.10 | ⊗ | x | x |
| 3-F-4 | 0.8 | 0.2 | 1 | 57.0 | 0.10 | x | x | x |

Thus, a recording medium has been described according to the present invention. Many modifications and variations may be made to the techniques and structures described and illustrated herein without departing from the spirit and scope of the invention. Accordingly, it should be understood that the media and methods described herein are illustrative only and are not limiting upon the scope of the invention.

EXPLANATION OF REFERENCE NUMERALS

1 Recording medium
2 Substrate
3 Magnetic layer
4 Protective layer
41 Underlayer
42 Carbon layer
5 Lubrication layer

What is claimed is:

1. A method of manufacturing a recording medium, comprising:
   forming a magnetic layer on a substrate;
   forming an underlayer on the magnetic layer, the underlayer comprising a material selected from the group consisting of silicon, silicon carbide and germanium, a thickness of the underlayer being 0.3 nm or greater and 1.8 nm or less, and
   forming a carbon layer comprising amorphous carbon containing hydrogen on the underlayer, an amount of hydrogen included in the carbon layer being 24.7 at % or higher and 46.8 at % or lower, and a thickness of the carbon layer being 0.2 nm or greater and 1.7 nm or less
   wherein the carbon layer is formed by ECWR with an output power of 190 W to 1050 W and a pressure of 0.09 Pa to 0.35 Pa
   wherein either an ECWR plasma source was used with an output power of 1050 W and a pressure of 0.09 Pa applied to deposit an carbon layer with a targeted hydrogen content of 30 at % or an ECWR plasma source was used with an output power of 190 W and a pressure of 0.35 Pa applied to deposit a carbon layer with a targeted hydrogen content of 45 at %.

2. The method according to claim 1, wherein the underlayer is formed using a sputtering target comprising a material selected from the group consisting of silicon, silicon carbide and germanium, using argon gas under conditions of a pressure of 0.5 Pa and output power of 100 W.

3. The method according to claim 1, wherein the carbon layer is formed a hydrocarbon gas or a hydrocarbon liquid.

4. The method according to claim 1, wherein the carbon layer is formed using ethylene or acetylene.

5. The method according to claim 1, wherein the carbon layer is formed using xylene, toluene, or benzene.

6. The method according to claim 1, wherein an ECWR plasma source was used with an output power of 1050 W and a pressure of 0.09 Pa applied to deposit an carbon layer with a targeted hydrogen content of 30 at %.

7. The method according to claim 1, wherein an ECWR plasma source was used with an output power of 190 W and a pressure of 0.35 Pa applied to deposit a carbon layer with a targeted hydrogen content of 45 at %.

8. The method according to claim 1, wherein a total film thickness of the underlayer and carbon layer is 1 nm.

9. A recording medium for recording and reproducing information by means of a head which performs information readout and writing based on magnetic principles, the recording medium comprising:
   a substrate;
   a magnetic layer formed on a substrate; and a protective layer formed on the magnetic layer, the protective layer comprising:

an underlayer formed on the magnetic layer comprising a material selected from the group consisting of elemental silicon and elemental germanium, a thickness of the underlayer being 0.3 nm or greater and 1.8 nm or less, and a carbon layer comprising amorphous carbon containing hydrogen formed on the underlayer, an amount of hydrogen included in the carbon layer being 24.7 at % or higher and 46.8 at % or lower, and a thickness of the carbon layer being 0.2 nm or greater and 1.7 nm or less.

10. The recording medium according to claim 9, wherein the underlayer comprises elemental silicon.

11. The recording medium according to claim 9, wherein the underlayer comprises elemental germanium.

12. The recording medium according to claim 9, wherein the underlayer consists of silicon.

13. The recording medium according to claim 9, wherein the underlayer consists of germanium.

* * * * *